United States Patent
Shin et al.

(10) Patent No.: US 12,069,881 B2
(45) Date of Patent: Aug. 20, 2024

(54) BONDING MEMBER, DISPLAY MODULE, AND METHOD OF FABRICATING DISPLAY DEVICE

(71) Applicant: Samsung Display Co., Ltd., Yongin-si (KR)

(72) Inventors: Yong Hwan Shin, Asan-si (KR); Sung Chul Kim, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 269 days.

(21) Appl. No.: 16/837,951

(22) Filed: Apr. 1, 2020

(65) Prior Publication Data
US 2020/0358027 A1 Nov. 12, 2020

(30) Foreign Application Priority Data
May 7, 2019 (KR) .................. 10-2019-0052999

(51) Int. Cl.
*H10K 50/842* (2023.01)
*B32B 3/26* (2006.01)
*B32B 7/12* (2006.01)
*H10K 50/86* (2023.01)
*H10K 71/00* (2023.01)

(52) U.S. Cl.
CPC ......... *H10K 50/8426* (2023.02); *B32B 3/266* (2013.01); *B32B 7/12* (2013.01); *H10K 50/8428* (2023.02); *H10K 50/86* (2023.02); *H10K 71/00* (2023.02); *B32B 2457/20* (2013.01)

(58) Field of Classification Search
CPC .................. B32B 3/02; B32B 3/30; H01L 27/3241–3293
See application file for complete search history.

(56) References Cited

U.S. PATENT DOCUMENTS

| | | | |
|---|---|---|---|
| 7,586,060 B2 | 9/2009 | Urairi et al. | |
| 10,525,672 B2 | 1/2020 | Lee et al. | |
| 2008/0108723 A1* | 5/2008 | Taniguchi | G03F 7/0751 |
| | | | 522/152 |

(Continued)

FOREIGN PATENT DOCUMENTS

| | | |
|---|---|---|
| CN | 104183615 A | 12/2014 |
| CN | 103608419 B | 4/2015 |

(Continued)

OTHER PUBLICATIONS

Korean Office Action dated Jan. 1, 2024, in Korean Patent Application No. 10-2019-0052999 (with English translation).

*Primary Examiner* — Erik Kielin
(74) *Attorney, Agent, or Firm* — CANTOR COLBURN LLP

(57) ABSTRACT

A bonding member of a display device, a display module, and a method of fabricating a display device to provide a hole in an active area of the display device includes: providing a bonding member which including a bonding layer, a first protective film disposed on the bonding layer and having a light absorbing pattern, and a second protective film disposed under the bonding layer; attaching a display panel to a surface of the bonding layer by peeling off the second protective film; and forming a through hole extending through the bonding layer, the first protective film and the display panel, in an area where the light absorbing pattern is disposed.

6 Claims, 16 Drawing Sheets

(56) References Cited

U.S. PATENT DOCUMENTS

| | | | |
|---|---|---|---|
| 2010/0085518 A1* | 4/2010 | Choi | G03F 7/0007 430/7 |
| 2014/0184935 A1* | 7/2014 | Kim | G06F 3/041 349/12 |
| 2015/0028307 A1* | 1/2015 | Kim | H01L 51/5246 257/40 |
| 2017/0005291 A1 | 1/2017 | Sung et al. | |
| 2017/0287992 A1* | 10/2017 | Kwak | H04N 23/57 |
| 2019/0077121 A1* | 3/2019 | Lee | G06F 1/1637 |
| 2020/0105853 A1* | 4/2020 | Kwon | H01L 27/3272 |
| 2020/0168844 A1* | 5/2020 | Kim | H01L 51/5271 |
| 2020/0273934 A1* | 8/2020 | You | G06F 1/1643 |
| 2020/0411790 A1* | 12/2020 | Wen | G06F 3/041 |
| 2021/0271130 A1* | 9/2021 | Mao | G02B 1/14 |

FOREIGN PATENT DOCUMENTS

| | | | |
|---|---|---|---|
| CN | 106775044 A | | 5/2017 |
| CN | 107241465 A | | 10/2017 |
| CN | 109194787 A | | 1/2019 |
| CN | 109196393 A | | 1/2019 |
| CN | 109493722 A | | 3/2019 |
| JP | 2002-060234 | | 2/2002 |
| JP | 2003-334675 | | 11/2003 |
| KR | 10-2008-0054206 | | 6/2008 |
| KR | 10-1102728 | | 1/2012 |
| KR | 20140069680 A | | 6/2014 |
| KR | 10-2016-0083609 | * | 7/2016 |
| KR | 10-2017-0005215 | | 1/2017 |
| KR | 10-2019-0030241 | | 3/2019 |

\* cited by examiner

300: 310, 320, 330, 325, 327

BONDING MEMBER, DISPLAY MODULE, AND METHOD OF FABRICATING DISPLAY DEVICE

CROSS REFERENCE TO RELATED APPLICATION

This application claims priority from and the benefit of Korean Patent Application No. 10-2019-0052999, filed on May 7, 2019, which is hereby incorporated by reference for all purposes as if fully set forth herein.

BACKGROUND

Field

Exemplary implementations of the invention relate generally to display devices and, more specially, to a bonding member of a display device, a display module, and a method of fabricating a display device to provide a hole in an active area of the display device.

Discussion of the Background

A display device is a device that displays an image and includes a display panel such as an organic light emitting display panel or a liquid crystal display panel. The display device may include a window for protecting the display panel from external impact. In particular, windows are widely applied to portable electronic devices such as smartphones.

Recently, a display device having a hole in an active area for inserting a camera, an infrared sensor, etc. to reduce the bezel area has been developed.

The above information disclosed in this Background section is only for understanding of the background of the inventive concepts, and, therefore, it may contain information that does not constitute prior art.

SUMMARY

Applicant discovered that when a hole in an active area is formed by a laser simultaneously in the display panel and an inter-module bonding layer for attaching the display panel and the window together, sufficient thermal energy may not be transferred to the inter-module bonding layer. This may cause a defect in the display module by not producing a completely formed hole and/or an adhesion defect due to foreign matter sticking to the inter-module bonding layer in the hole fabrication process.

Bonding members and display modules of display devices constructed according to exemplary implementations of the invention are capable of reducing or preventing defects due to incomplete holes and/or adhesion of foreign matter to an inter-module bonding layer in a hole fabrication process.

Methods of fabricating display devices according to exemplary implementations of the invention are capable of reducing or preventing defects due to incomplete holes and/or adhesion of foreign matter to an inter-module bonding layer and the resulting defects in the display device.

Additional features of the inventive concepts will be set forth in the description which follows, and in part will be apparent from the description, or may be learned by practice of the inventive concepts.

According to an aspect of the invention, a method of fabricating a display device includes the steps of: providing a bonding member including a bonding layer, a first protective film disposed on the bonding layer and having a light absorbing pattern, and a second protective film disposed under the bonding layer; attaching a display panel to a surface of the bonding layer by peeling off the second protective film; and forming a through hole extending through the bonding layer, the first protective film and the display panel, in an area where the light absorbing pattern is disposed.

The light absorbing pattern may have a surface area approximately equal to or greater than the surface area of the through hole.

The light absorbing pattern may be formed on substantially the entire surface of the first protective film.

The step of forming of the through hole may be performed using an ultraviolet laser.

The light absorbing pattern may include an ultraviolet light absorbing pattern that absorbs light in an ultraviolet wavelength band.

The light absorbing pattern may be disposed on a first surface of the first protective film that contacts the bonding layer or on a second surface opposite the first surface.

The light absorbing pattern may be directly coated on the first surface or the second surface of the first protective film.

The light absorbing pattern may be disposed inwardly from outer edges of the first protective film.

The light absorbing pattern may be further disposed along edges of the first protective film.

The method may further include the steps of peeling off the first protective film after forming the through hole and attaching a window to the first protective film (the other surface of the bonding layer) from which the first protective film has been peeled off.

According to another aspect of the invention, a display module for a display device includes: a display panel; a first inter-module bonding layer disposed on an upper surface of the display panel; a first protective film having first surface and second opposed surfaces, the first protective film being disposed on an upper surface of the first inter-module bonding layer and having a light absorbing pattern disposed on the first surface or the second surface of the first protective film; and a through hole extending through the display panel, the first inter-module bonding layer and the first protective film, wherein the light absorbing pattern at least partially surrounds the through hole.

The light absorbing pattern may be directly disposed on the first surface or the second surface of the first protective film.

The light absorbing pattern may include an ultraviolet light absorbing pattern to absorb light in an ultraviolet wavelength band.

The light absorbing pattern may have a generally annular shape and be disposed inwardly from outer edges of the first protective film.

The display panel may include: a display member including a substrate and a light emitting layer disposed on the substrate; an optical film disposed on the display member; and a second inter-module bonding layer to attach the display member and the optical film together, wherein the first inter-module bonding layer may have a first thickness and the second inter-module bonding layer may have a second thickness smaller than the first thickness.

The optical film may include a polarizing film.

According to still another aspect of the invention, a bonding member for a display device includes: a bonding layer; a first protective film disposed on the bonding layer and has a light absorbing pattern; and a second protective film disposed under the bonding layer.

The first protective film may have first and second opposed surfaces, with the first surface contacting the bonding layer, and the light absorbing pattern may be disposed on the first or second surface.

The light absorbing pattern may be disposed inwardly from outer edges of the first protective film.

The light absorbing pattern may be further disposed along edges of the first protective film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
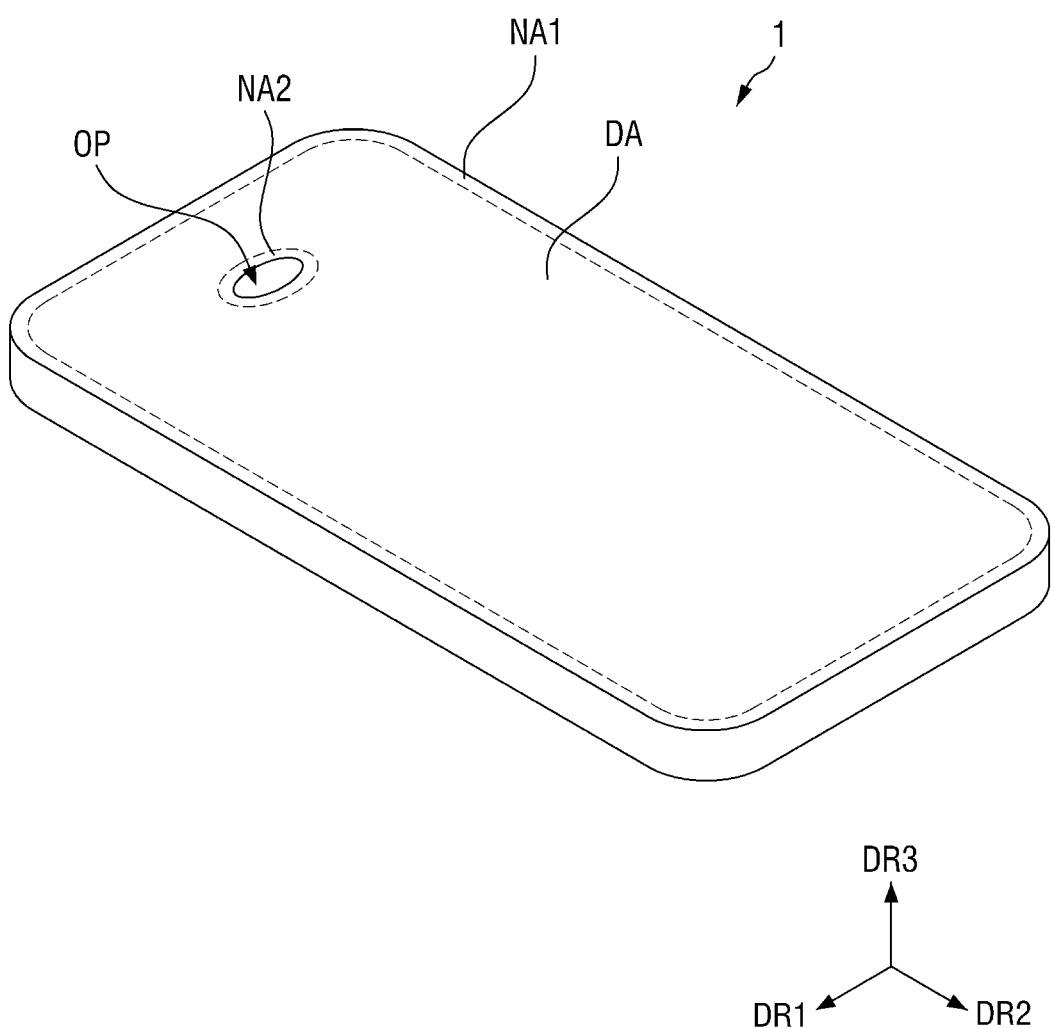
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
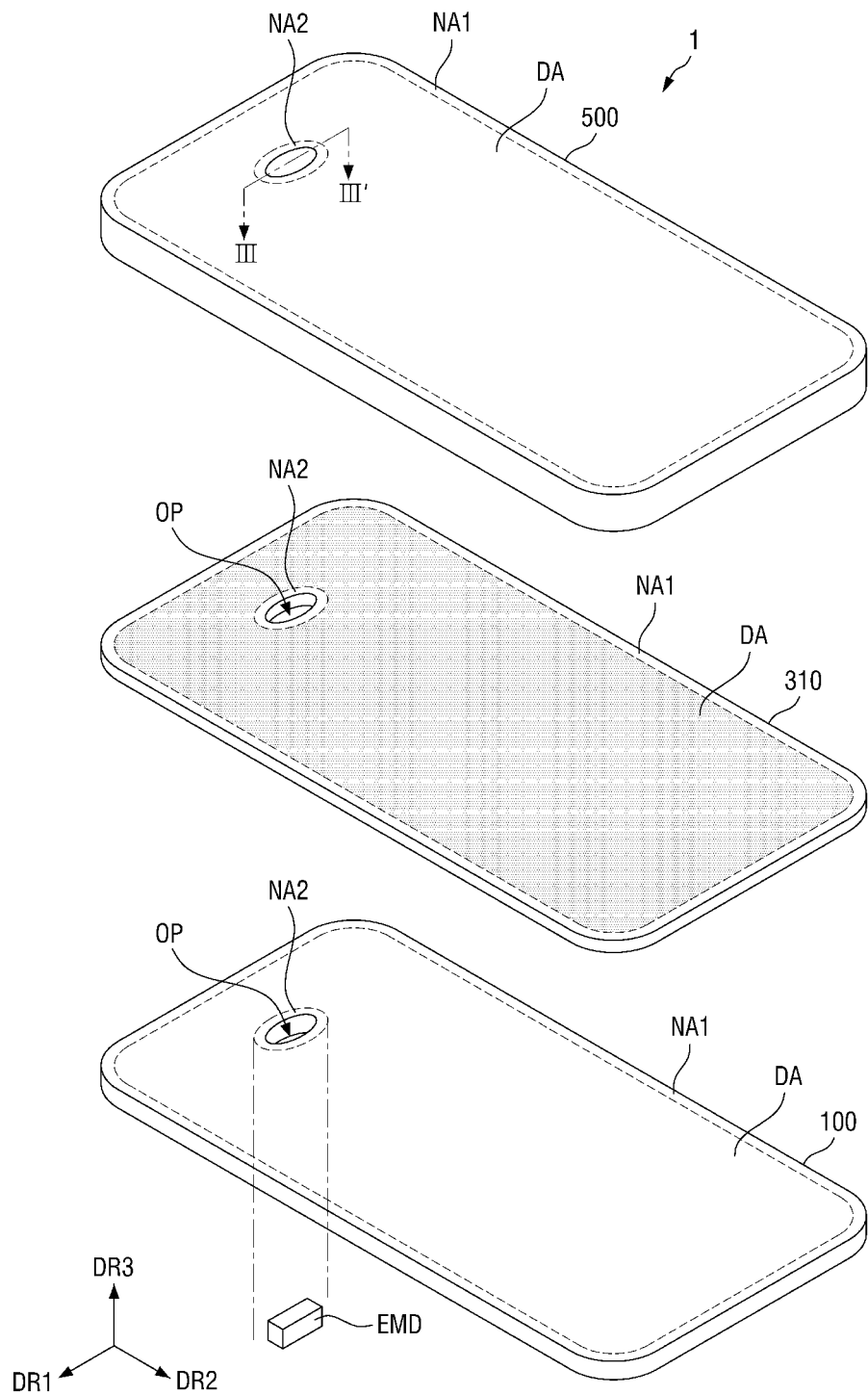
FIG. 2 is an exploded perspective view of the display device of FIG. 1.
Figure 3:
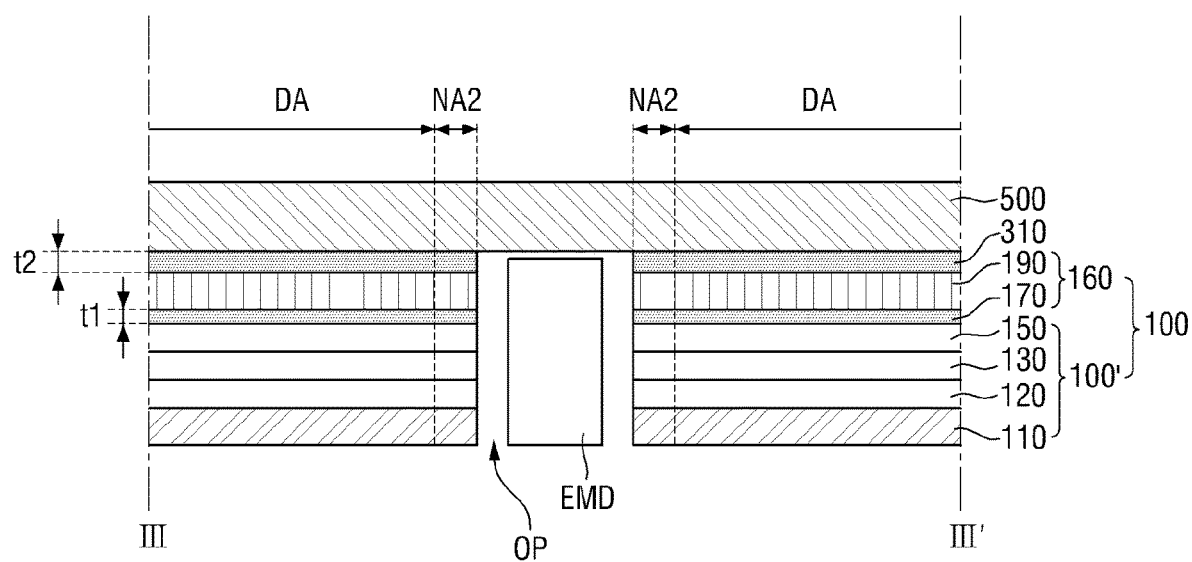
FIG. 3 is a cross-sectional view taken along line of FIG. 2.

FIG. 1 is a perspective view of an exemplary embodiment of a display device 1 constructed according to the principles of the invention. FIG. 2 is an exploded perspective view of the display device 1 of FIG. 1. FIG. 3 is a cross-sectional view taken along line of FIG. 2.

In exemplary embodiments, a first direction DR1 and a second direction DR2 intersecting each other in different directions, for example, in directions normal to each other in plan view. A third direction DR3 intersects a plane in which the first direction DR1 and the second direction DR2 lie, for example, a direction normal to both the first direction DR1 and the second direction DR2. In the drawings, the first direction DR1 indicates a horizontal direction of the display device 1, the second direction DR2 indicates a vertical direction of the display device 1, and the third direction DR3 indicates a thickness direction of the display device 1. In the following exemplary embodiments, a side in the first direction DR1 refers to a right direction in plan view, the other side in the first direction DR1 refers to a left direction in plan view, a side in the second direction DR2 refers to an upward direction in plan view, the other side in the second direction DR2 refers to a downward direction in plan view, a side in the third direction DR3 refers to an upward direction in cross-sectional view, and the other side in the third direction DR3 refers to a downward direction in cross-sectional view. However, directions mentioned in exemplary embodiments should be understood as relative directions, and the exemplary embodiments are not limited to the specifically described directions.

Referring to FIGS. 1 through 3, the display device 1 includes a display panel 100 and a window 500 disposed above the display panel 100. The display device 1 may further include an inter-module bonding layer (or a first inter-module bonding layer) 310 disposed between the display panel 100 and the window 500.

The display device 1 may be generally rectangular in plan view. The display device 1 may include both long sides and both short sides. Each corner where a long side and a short side of the display device 1 meet may be right-angled, but may also be curved as illustrated in FIG. 1. The planar shape of the display device 1 is not limited to this example and may also be a circular shape or other shapes.

The display device 1 includes a display area DA where a screen image is output and a first non-display area NA1 located around the display area DA. No image may be output in the first non-display area NA1. The display area DA may include a plurality of pixels. When the planar shape of the display device 1 is a generally rectangular shape having curved corners, the first non-display area NA1 may be located along edges of the display area DA.

The display panel 100 is a panel that displays a screen and may be, for example, an organic light emitting display panel. Although the example where an organic light emitting display panel is used as the display panel 100 will be described in the following exemplary embodiments, other types of display panels such as a liquid crystal display and an electrophoresis device or other known devices can also be used as the display panel 100.

The display panel 100 may include a display member 100' and an optical film 160 disposed on the display member 100'. The display member 100' may include a base substrate 110, a circuit layer 120 disposed on the base substrate 110, an organic light emitting layer 130 disposed on the circuit layer 120, and an encapsulating layer 150 disposed on the organic light emitting layer 130.

The circuit layer 120 may control the amount of light emitted from the organic light emitting layer 130. The circuit layer 120 may include display wirings, display electrodes, and at least one thin-film transistor. The organic light emitting layer 130 may include an organic light emitting material. The organic light emitting layer 130 may be sealed by the encapsulating layer 150. The encapsulating layer 150 may seal the organic light emitting layer 130 to prevent moisture and the like from permeating into the organic light emitting layer 130 from the outside. The encapsulating layer 150 may be composed of a single inorganic layer or multiple inorganic layers or may be composed of an inorganic layer and an organic layer stacked alternately.

The base substrate 110 may be a rigid substrate made of, e.g., glass or a flexible substrate made of, e.g., polyimide. When a polyimide substrate is applied as the base substrate 110, the display panel 100 can be curved, bent, folded, or rolled.

The optical film 160 may be disposed on the display member 100' of the display panel 100. The optical film 160 may include a polarizing layer 190 which adjusts the amount of light emitted from the organic light emitting layer 130 and a second inter-module bonding layer 170 which bonds the polarizing layer 190 and the encapsulating layer 150 of the display member 100' together. The second inter-module bonding layer 170 may include a pressure sensitive adhesive (PSA).

The planar shape of the display panel 100 may be the same as or substantially similar to the above-described planar shape of the display device 1. That is, the display panel 100 may be shaped generally like a rectangle with rounded corners in plan view.

The window 500 is disposed above the display panel 100. The window 500 is disposed above the display panel 100 to protect the display panel 100 and to transmit light emitted from the display panel 100.

The window 500 may overlap the display panel 100 and cover the entire surface of the display panel 100. The window 500 generally has a similar planar shape to the display panel 100 but may be larger than the display panel 100. For example, the window 500 may protrude further outwardly than the display panel 100 at both short sides of the display device 1. The window 500 may also protrude from the display panel 100 at both long sides of the display device 1. However, the protruding distance of the window 500 may be greater t both short sides. Like the planar shape of the display device 1, the planar shape of the window 500 may be a generally rectangular shape including both long sides and both short sides.

The window 500 includes a first surface and a second surface. When the window 500 is mounted on the display device 1, the first surface of the window 500 may be a surface facing the display panel 100, and the second surface of the window 500 may be a surface where a screen image is output.

The window 500 may include a base member and a print pattern. The print pattern may be disposed on a surface of the base member. The base member may be made of a transparent material. The base member may include, for example, glass or plastic. When the base member includes plastic, it may have flexible properties.

Examples of plastic applicable to the base member include, but are not limited to, polyimide, polyacrylate, polymethyl methacrylate (PMMA), polycarbonate (PC), polyethylene naphthalate (PEN), polyvinylidene chloride, polyvinylidene difluoride (PVDF), polystyrene, ethylene vinylalcohol copolymer, polyethersulfone (PES), polyetherimide (PEI), polyphenylene sulfide (PPS), polyallylate, triacetyl cellulose (TAC), and cellulose acetate propionate (CAP). When the base member includes plastic, a coating layer disposed on upper and lower surfaces of the plastic may be further included. In an exemplary embodiment, the coating layer may be a hard coating layer including an organic layer containing an acrylate compound and/or an organic-inorganic hybrid layer. The organic layer may include an acrylate compound. The organic-inorganic hybrid layer may be a layer in which an inorganic material such as silicon oxide, zirconium oxide, aluminum oxide, tantalum oxide, niobium oxide, or glass beads is dispersed in an organic material such as an acrylate compound. In an exemplary embodiment, the coating layer may include a metal oxide layer. The metal oxide layer may include, but is not limited to, a metal oxide such as titanium, aluminum, molybdenum, tantalum, copper, indium, tin or tungsten.

The print pattern is disposed on the surface of the base member. The print pattern may be disposed along edges of the base member. The print pattern may be disposed to overlap the non-display area of the display panel 100 so as to prevent the non-display area of the display panel 100 from being visible.

The first inter-module bonding layer 310 for bonding the window 500 and the display panel 100 together may be disposed between the window 500 and the display panel 100. The window 500 and the display panel 100 may be bonded to each other by the first inter-module bonding layer 310. The first inter-module bonding layer 310 may include an adhesive material having transparent properties. For example, the first inter-module bonding layer 310 may include an optically clear adhesive (OCA) or an optically clear resin (OCR).

The first inter-module bonding layer 310 may be disposed to overlap the display panel 100 and cover substantially the entire surface of the display panel 100. The first inter-module bonding layer 310 may have the same or substantially similar shape as the display panel 100 in plan view.

The thickness of the first inter-module bonding layer 310 may be greater than that of the second inter-module bonding layer 170. For example, a second thickness t2 of the first inter-module bonding layer 310 may be greater than a first thickness t1 of the second inter-module bonding layer 170 as shown in FIG. 3. The second thickness t2 may have a thickness range of about 75 μm to about 200 μm, and the first thickness t1 may have a thickness range of about 10 μm to about 30 μm. As will be described later, a hole is formed to pass through the display panel 100 and the first inter-module bonding layer 130 in the thickness direction. Here, since the second thickness t2 of the first inter-module bonding layer 310 is greater than the first thickness t1 of the second inter-module bonding layer 170, greater thermal energy may be required when a through hole is formed in the first inter-module bonding layer 310 than when a through hole is formed in the second inter-module bonding layer 170.

The display device 1 according to the exemplary embodiment may further include a through hole OP which passes through the display panel 100 and the first inter-module bonding layer 310 in the thickness direction. In addition, the display device 1 according to the exemplary embodiment may further include a second non-display area NA2 located around the through hole OP. The through hole OP may be located inside the display device 1. The through hole OP may have a circular or elliptical planar shape in plan view. However, the planar shape of the through hole OP is not limited to these exemplary embodiments, and various other shapes such as a triangle and a quadrilateral may also be applied as the planar shape of the through hole OP.

Although only one through hole OP is illustrated in FIGS. 1 through 3, exemplary embodiments are not limited to this case, and a plurality of through holes OP may also be provided.

The second non-display area NA2 may be located around the through hole OP. The second non-display area NA2 may completely or partially surround the through hole OP in plan view. The display area DA may completely or partially surround the second non-display area NA2 in plan view. Like the first non-display area NA1, the second non-display area NA2 may be an area where no image is displayed. For example, the second non-display area NA2 may be an area where the pixels of the display panel 100 are not disposed and the display wirings of the circuit layer 120 for connecting adjacent pixels bypass the through hole OP.

The through hole OP may pass through the stacked structure of the display panel 100 and the first inter-module bonding layer 310 along the through direction DR3 but may not pass through the window 500. For example, as shown in FIG. 3, an electronic element EMD may be disposed in the through hole OP. The electronic element EMD may include, but is not limited to an electronic component such as a camera, an infrared camera, or an infrared sensor, or the like.

A display module according to an exemplary embodiment will now be described.

Figure 4:
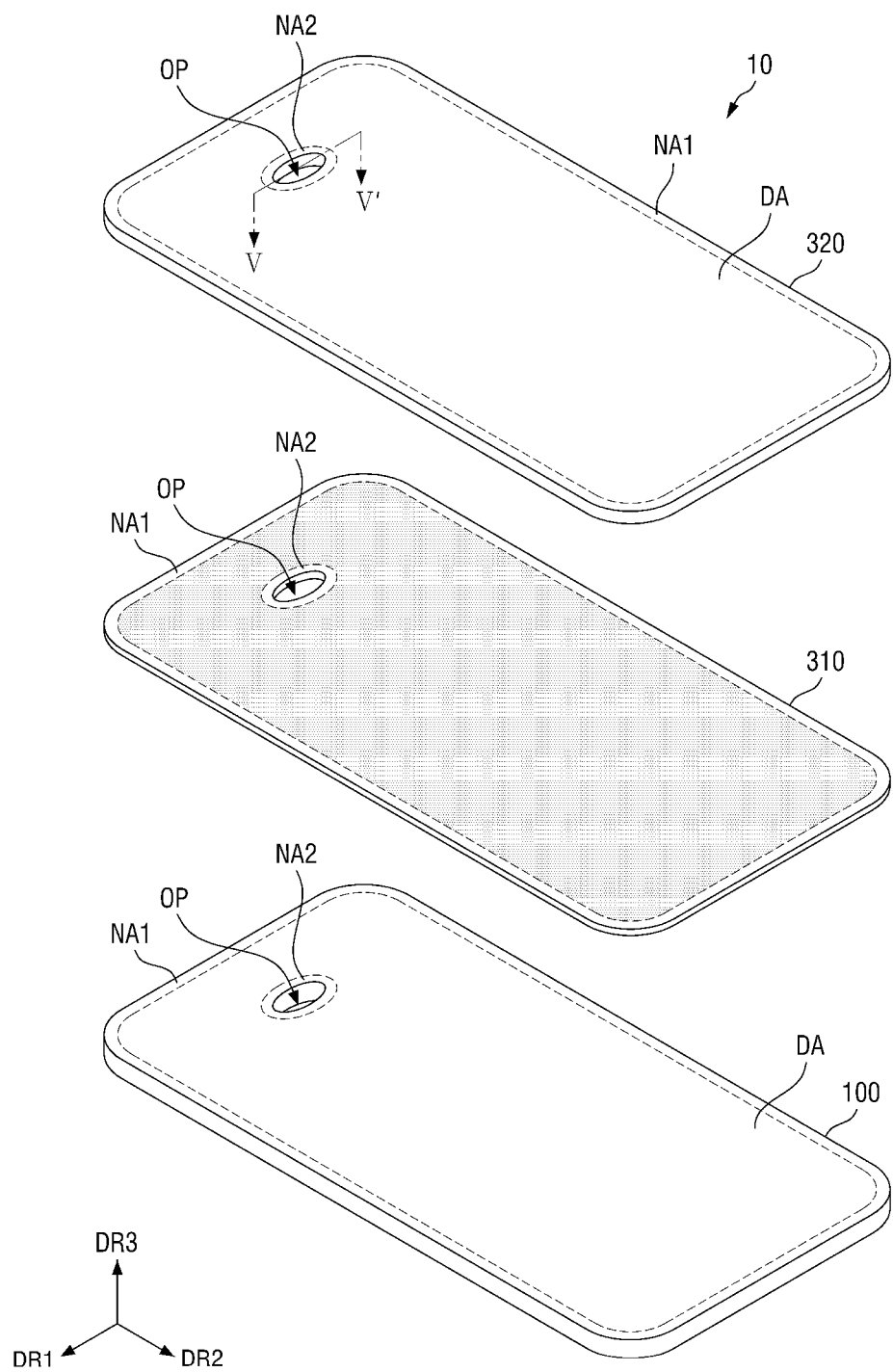
FIG. 4 is an exploded perspective view of an exemplary embodiment of a display module constructed according to the principles of the invention.
Figure 5:
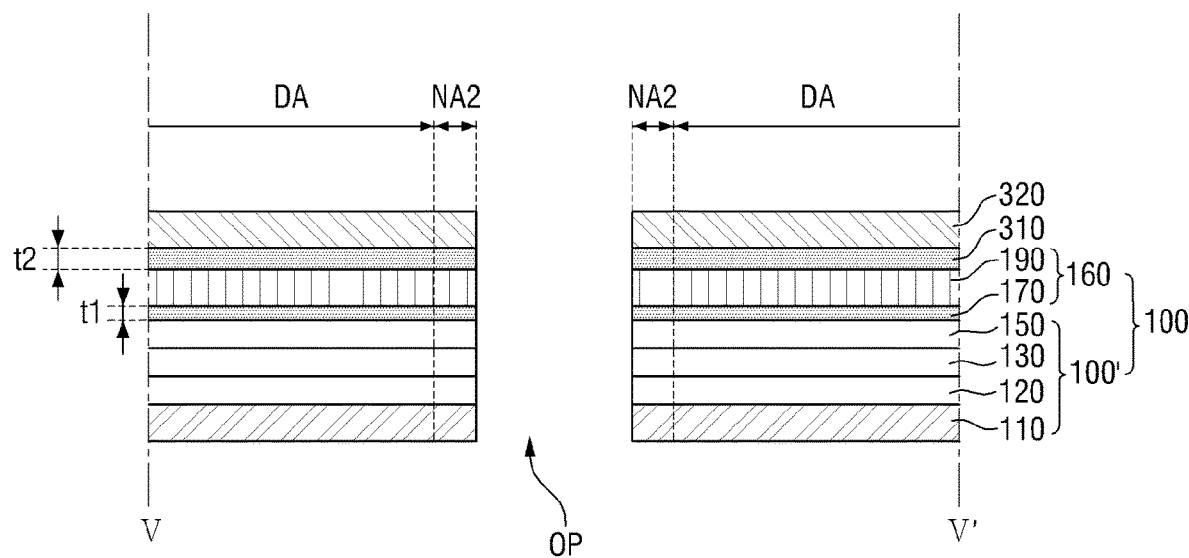
FIG. 5 is a cross-sectional view taken along line V-V' of FIG. 4.

FIG. 4 is an exploded perspective view of an exemplary embodiment of a display module 10 constructed according to the principles of the invention. FIG. 5 is a cross-sectional view taken along line V-V' of FIG. 4.

Referring to FIGS. 4 and 5, the display module 10 according to the exemplary embodiment may include the display panel 100 described above, the first inter-module bonding layer 310, and a first protective film 320 disposed on the first inter-module bonding layer 310.

The first protective film 320 may be disposed on a first surface of the first inter-module bonding layer 310 and overlap the first inter-module bonding layer 310 in the thickness direction. The first protective film 320 may have the same or substantially similar planar size as the first inter-module bonding layer 310 to cover and protect the first surface of the first inter-module bonding layer 310.

The first protective film 320 may be attached to and protect the first surface of the first inter-module bonding layer 310 before the display module 10 is attached to the window 500 described in FIG. 1, but may be peeled off and removed when the display module 10 is attached to the window 500.

The first protective film 320 may include at least one of polyethylene terephthalate (PET), polyurethane (PU), polyimide (PI), polycarbonate (PC), polyethylene (PE), polypropylene (PP), polysulfone (PSF), polymethyl methacrylate (PMMA), triacetyl cellulose (TAC), and cyclo olefin polymer (COP).

The through hole OP described in FIGS. 1 through 3 may also be provided in the display module 10 according to the exemplary embodiment. That is, the display module 10 may include the through hole OP passing through the display panel 100, the first inter-module bonding layer 310, and the first protective film 320 in the thickness direction. The position of the through hole OP in FIG. 4 is the same as the position of the through hole OP in FIGS. 1 through 3.

A bonding member according to an exemplary embodiment will now be described.

Figure 6:
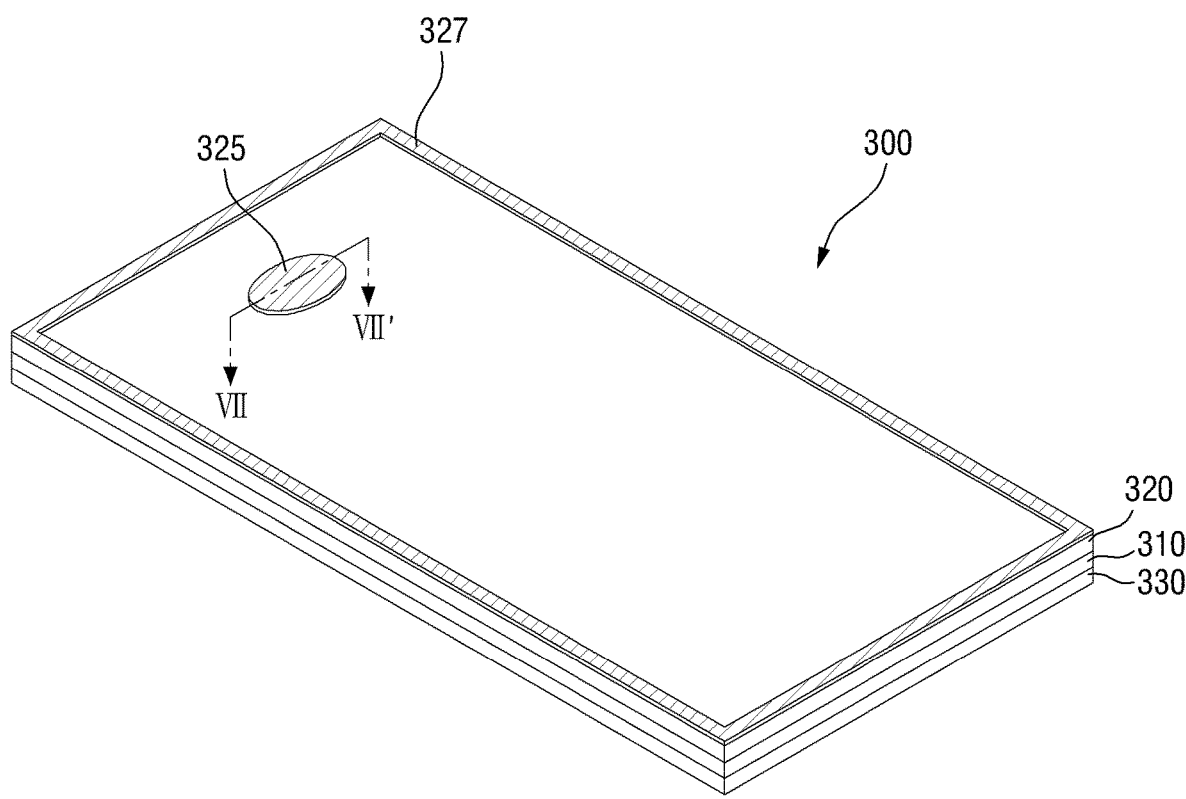
FIG. 6 is a perspective view of an exemplary embodiment of a bonding member constructed according to the principles of the invention.
Figure 6:
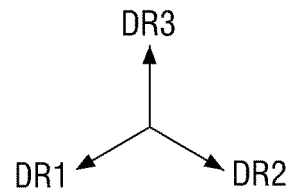
Figure 7:
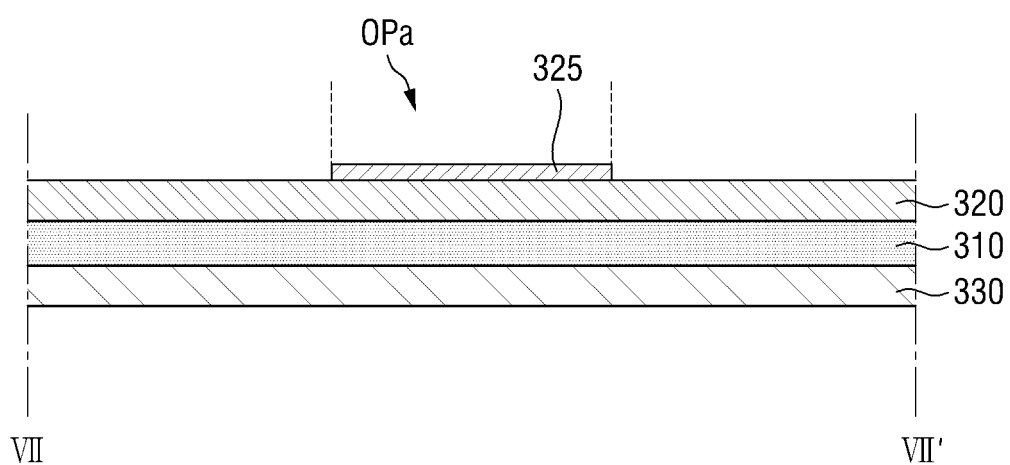
FIG. 7 is a cross-sectional view taken along line VII-VII' of FIG. 6.

FIG. 6 is a perspective view of an exemplary embodiment of a bonding member 300 constructed according to the principles of the invention. FIG. 7 is a cross-sectional view taken along line VII-VII' of FIG. 6.

Referring to FIGS. 6 and 7, the bonding member 300 according to the exemplary embodiment may include the first inter-module bonding layer 310 described above, the first protective film 320 disposed on the first inter-module bonding layer 310, and a second protective film 330 disposed under the first inter-module bonding layer 310. The bonding member 300 may further include light absorbing patterns disposed on at least one surface of the first protective film 320. The light absorbing patterns may include a hole area light absorbing pattern 325 and an edge light absorbing pattern 327 disposed on the first protective film 320. For example, the hole area light absorbing pattern 325 may disposed inwardly from the outer edges of the first protective film 320 and the edge light absorbing pattern 327 may be located along the outer edges of the first protective film 320.

Since an edge shaping process to be described later is not performed on the bonding member 300 according to the exemplary embodiment, the first inter-module bonding layer 310 and the first protective film 320 applied to the display module 10 may be shaped not like a rectangle with rounded corners, but like a rectangle with angled corners. The second protective film 330 may also be shaped like a rectangle with angled corners.

The second protective film 330 may be disposed on a second surface of the first inter-module bonding layer 310 and may overlap the first inter-module bonding layer 310 in the thickness direction. The second protective film 330 may have the same or substantially similar planar size as the first inter-module bonding layer 310 to cover and protect the second surface of the first inter-module bonding layer 310.

The second protective film 330 may be attached to and protect the second surface of the first inter-module bonding layer 310 before the bonding member 300 is attached to the display panel 100 described above, but may be peeled off and removed when the bonding member 300 is attached to the display panel 100.

The second protective film 330 may include at least one of polyethylene terephthalate (PET), polyurethane (PU), polyimide (PI), polycarbonate (PC), polyethylene (PE), polypropylene (PP), polysulfone (PSF), polymethyl methacrylate (PMMA), triacetyl cellulose (TAC), and cyclo olefin polymer (COP).

As will be described later, the light absorbing patterns may absorb light of a specific wavelength used in a hole forming process and/or an edge shaping process of the display module 10, thereby making it easy to penetrate the first inter-module bonding layer 310 which is adjacent to the light absorbing patterns in the thickness direction.

The light absorbing patterns 325, 327 may be determined according to the wavelength range of light used in the hole forming process and/or the edge shaping process of the display module 10. For example, the light absorbing patterns 325, 327 may include an ultraviolet wavelength absorber that absorbs light in an ultraviolet wavelength range and transmits light in the other wavelength ranges.

The hole area light absorbing pattern 325 and the edge light absorbing pattern 327 may include the same material and may be formed simultaneously in the same process. The hole area light absorbing pattern 325 and the edge light absorbing pattern 327 may have the same thickness.

As illustrated in FIG. 7, the hole area light absorbing pattern 325 may be disposed in a preliminary through hole area OPa having the same planar size as the through hole OP of FIG. 5. The hole area light absorbing pattern 325 may have the same planar size as the preliminary through hole area OPa. That is, the hole area light absorbing pattern 325 may be disposed to completely overlap the preliminary through hole area OPa. The hole area light absorbing pattern 325 may be disposed on the first protective film 320 and located inwardly from the outer edges of the first protective film 320.

The edge light absorbing pattern 327 may extend along the edges of the first protective film 320. The edge light absorbing pattern 327 may be continuously disposed along short sides of the first protective film 320 in the first direction DR1 and long sides of the first protective film 320 in the second direction DR2.

In some exemplary embodiments, if light in different wavelength ranges is used in the hole forming process and/or the edge shaping process of the display module 10, the hole area light absorbing pattern 325 and the edge light absorbing pattern 327 may include different materials. In this case, the hole area light absorbing pattern 325 and the edge light absorbing pattern 327 may be formed in different processes, and their thicknesses may be the same or different.

A method of fabricating a display device using the bonding member 300 and the display module 10 according to an exemplary embodiment will now be described.

Figure 8:
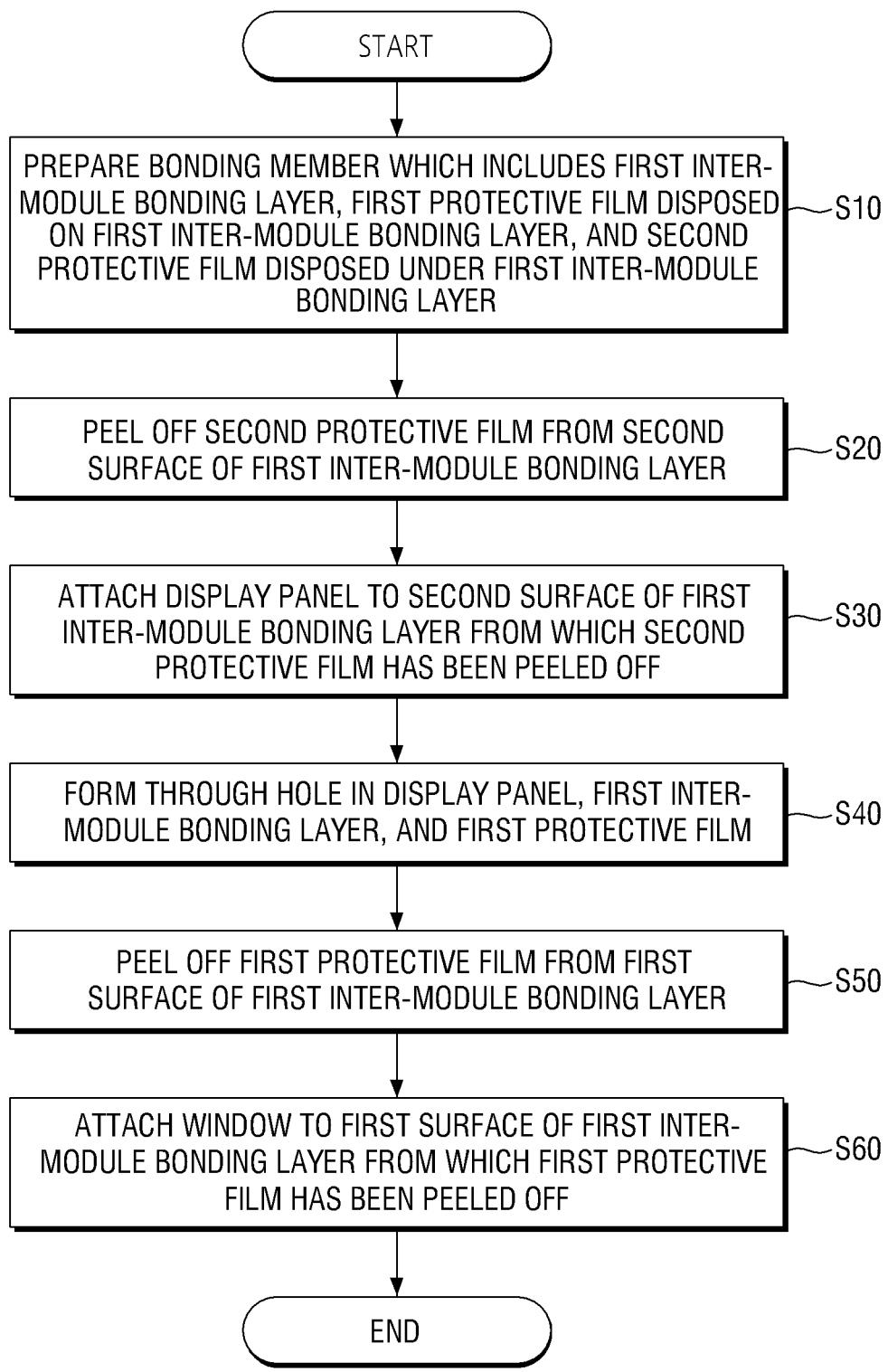
FIG. 8 is a flowchart of a method of fabricating a display device according to an exemplary embodiment of the invention.

FIG. 8 is a flowchart of a method of fabricating a display device according to an exemplary embodiment of the invention. FIGS. 9 through 12 are cross-sectional views illustrating steps of the method of fabricating a display device of FIG. 8.

Referring to FIG. 8, in the method of fabricating a display device according to the exemplary embodiment, the bonding member 300 described above in FIG. 6 is prepared (operation S10). The bonding member 300 may include the first inter-module bonding layer 310, the first protective film 320 disposed on the first inter-module bonding layer 310, and the second protective film 330 disposed under the first inter-module bonding layer 310. The first protective film 320 may be disposed on the first surface of the first inter-module bonding layer 310, and the second protective film 330 may be disposed on the second surface of the first inter-module bonding layer 310. In addition, the bonding member 300 may further include the light absorbing patterns 325 and 327 disposed on a first surface of the first protective film 320.

The light absorbing patterns 325 and 327 may be determined according to the wavelength range of light used in the hole forming process and/or the edge shaping process of the display module 10. For example, the light absorbing patterns 325 and 327 may include an ultraviolet wavelength absorber that absorbs light in an ultraviolet wavelength range and transmits light in the other wavelength ranges.

The hole area light absorbing pattern 325 and the edge light absorbing pattern 327 may include the same material and may be formed simultaneously in the same process. The hole area light absorbing pattern 325 and the edge light absorbing pattern 327 may have substantially the same thickness.

Each of the hole area light absorbing pattern 325 and the edge light absorbing pattern 327 may be directly formed on the first surface of the first protective film 320. Each of the hole area light absorbing pattern 325 and the edge light absorbing pattern 327 may be directly disposed (e.g., directly applied or coated) on the first surface of the first protective film 320.

The hole area light absorbing pattern 325 may be disposed in the preliminary through hole area OPa having the same planar size as the through hole OP of FIG. 5. The hole area light absorbing pattern 325 may have the same planar size as the preliminary through hole OPa. That is, the hole area light absorbing pattern 325 may be placed to completely overlap the preliminary through hole area OPa. The hole area light absorbing pattern 325 may be located inside the first protective film 320 in plan view.

The edge light absorbing pattern 327 may extend along the edges of the first protective film 320. The edge light absorbing pattern 327 may be continuously disposed along the short sides of the first protective film 320 in the first direction DR1 and the long sides of the first protective film 320 in the second direction DR2.

Figure 9:
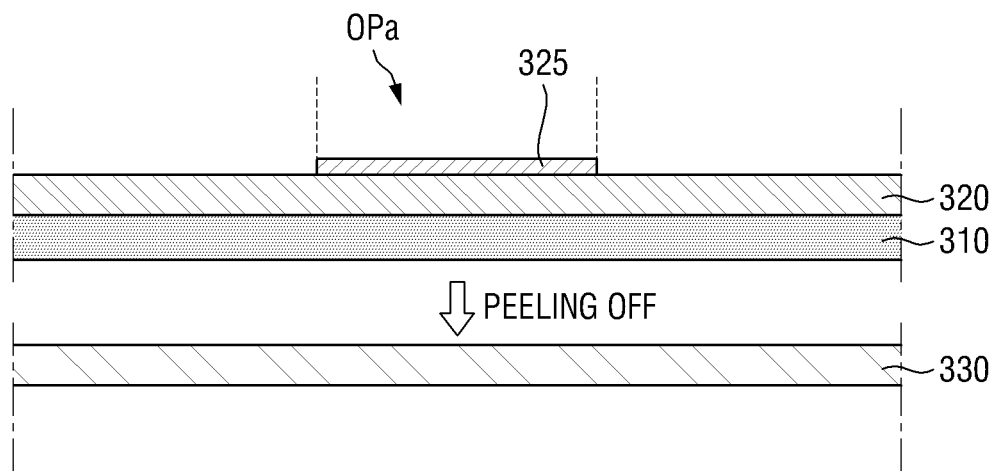
FIGS. 9 through 12 are cross-sectional views illustrating steps of the method of fabricating a display device of FIG. 8.

Referring to FIGS. 8 and 9, the second protective film 330 is peeled off from the second surface of the first inter-module bonding layer 310 (operation S20). The peeling off of the second protective film 330 from the second surface of the first inter-module bonding layer 310 (operation S20) may be performed by at least one pull-tab portion of the second protective film 330 which protrudes outwardly from the first inter-module bonding layer 310. Since the second protective film 330 includes at least one pull-tab portion protruding outwardly from the first inter-module bonding layer 310, it can be easily peeled off.

Figure 10:
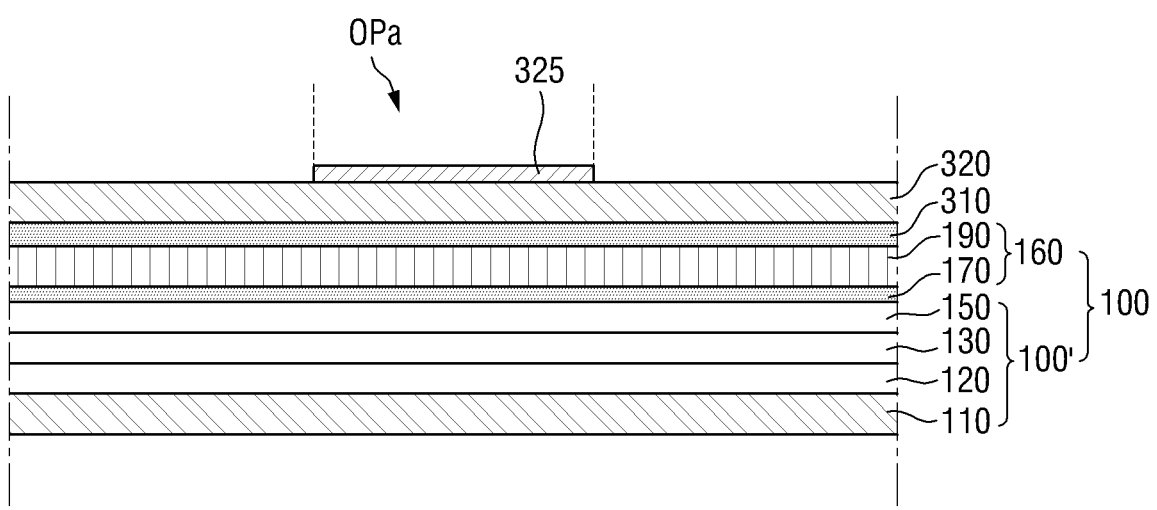

Referring to FIGS. 8 and 10, the display panel 100 is attached to the second surface of the first inter-module bonding layer 310 from which the second protective film 330 has been peeled off (operation S30). The optical film 160 of the display panel 100 may be attached to the second surface of the first inter-module bonding layer 310. Since the display panel 100 has been described above in detail, a redundant description thereof will be omitted.

Figure 11:
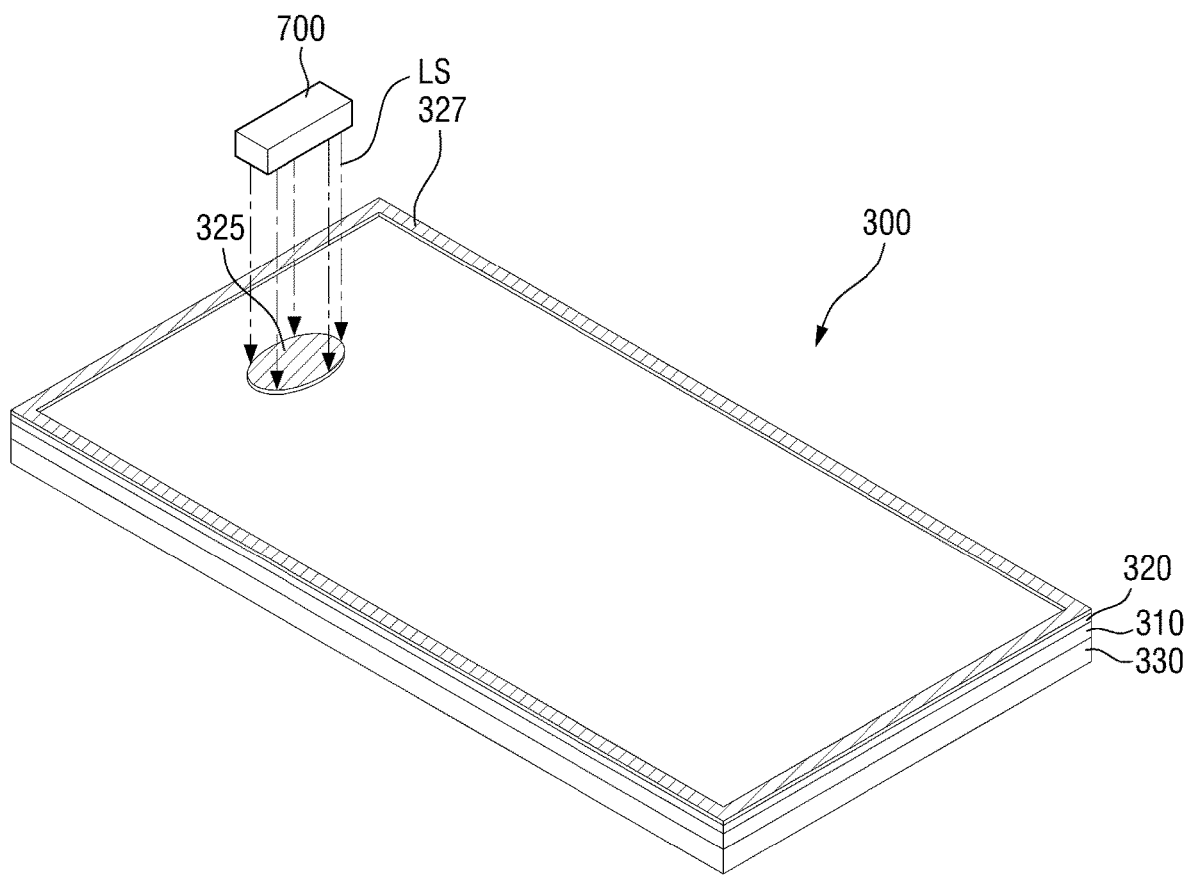

Referring to FIGS. 8 and 11, the through hole OP is formed in the display panel 100, the first inter-module bonding layer 310, and the first protective film 320 (operation S40). The forming of the through hole OP in the display panel 100, the first inter-module bonding layer 310, and the first protective film 320 includes simultaneously forming the through hole OP in the display panel 100, the first inter-module bonding layer 310, and the first protective film 320. The forming of the through hole OP (operation S40) may be performed using a laser device 700. The laser device 700 may irradiate the light absorbing patterns 325 and 327 formed on the first surface of the first protective film 320 with light LS in an ultraviolet wavelength band.

The forming of the through hole OP may further include irradiating light in the downward direction or the upward direction based on FIG. 11 by using the laser device 700. Assuming the light absorbing patterns 325 and 327 are not provided on the first protective film 320, when light is irradiated in the downward direction or the upward direction, sufficient thermal energy generated by the light LS may not be transferred to the first inter-module bonding layer 310. Therefore, the through hole OP may not be formed completely or at all. Instead, a sticky liquid may be generated by the material of the first inter-module bonding layer 310 melted by some thermal energy. The generated sticky liquid may adhere to the adjacent display panel 100 or a surface or side surfaces of the window 500 to be attached in a subsequent process, thus causing a module defect. In addition, foreign matter and the like may adhere to the sticky liquid, causing a foreign matter defect such as an adhesion defect which is caused by foreign matter sticking to the first inter-module bonding layer 310.

In the method of fabricating a display device according to the exemplary embodiment, the light absorbing patterns 325 and 327 formed on the first surface of the first protective film 320 better absorb light emitted from the laser device 700 when the through hole OP is formed. Therefore, since sufficient thermal energy is transferred to the first inter-module bonding layer 310, the through hole OP can be formed in a short time without generation of a sticky liquid, etc. due to the partial melting of the first inter-module bonding layer 310.

As a result of the inventive principles, the module defect or the foreign matter defect described above can be reduced or prevented.

Figure 12:
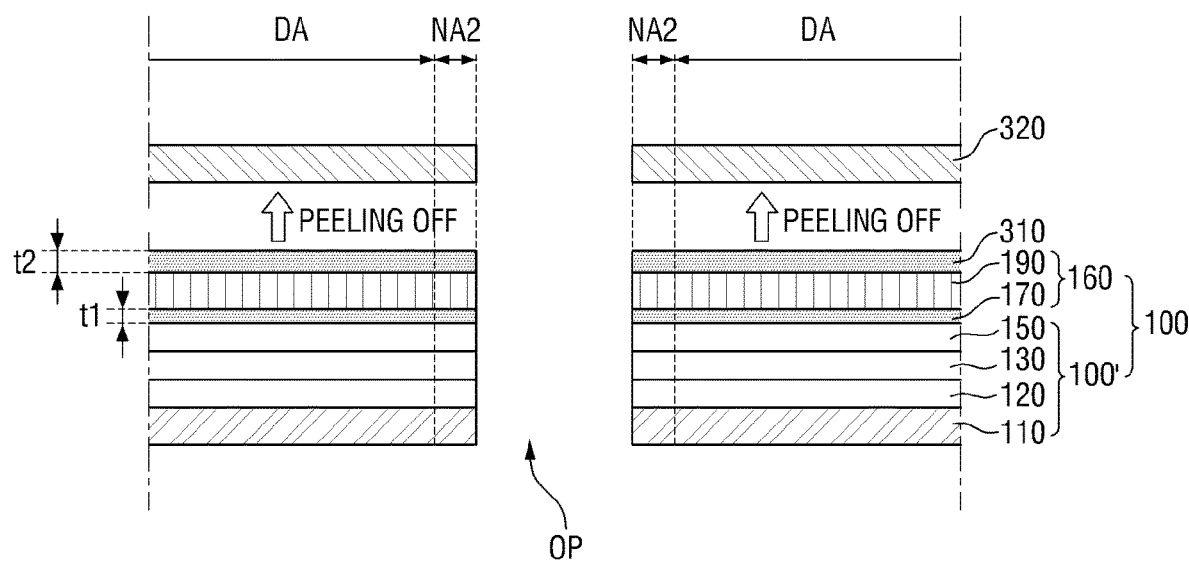

Referring to FIGS. 8 and 12, the first protective film 320 is peeled off from the first surface of the first inter-module bonding layer 310 (operation S50). The peeling off of the first protective film 320 from the first surface of the first inter-module bonding layer 310 (operation S50) may be performed by at least one pull-tab portion of the first protective film 320 which protrudes outwardly from the first inter-module bonding layer 310. Since the first protective film 320 includes at least one pull-tab portion protruding outwardly from the first inter-module bonding layer 310, it can be easily peeled off.

Referring to FIGS. 8 and 3, the window 500 is attached to the first surface of the first inter-module bonding layer 310 from which the first protective film 320 has been peeled off (operation S60).

Hereinafter, other exemplary embodiments will be described.

Figure 13:
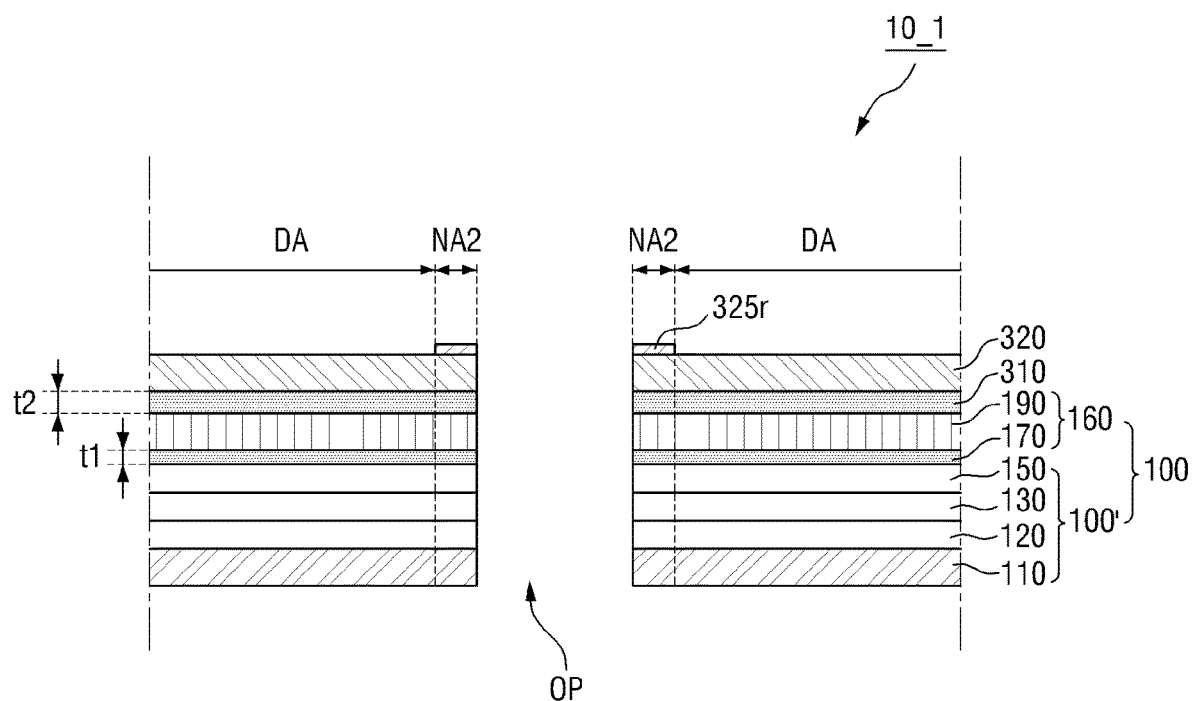
FIG. 13 is a cross-sectional view of an exemplary embodiment of a display module.
Figure 14:
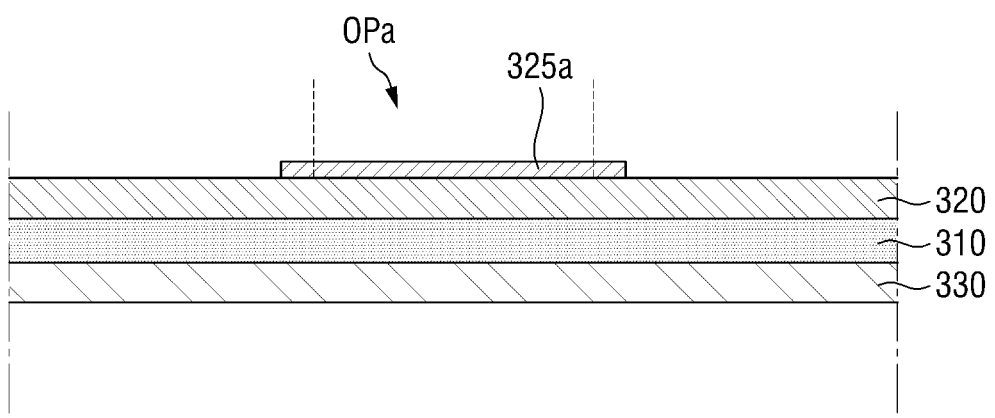
FIG. 14 is a cross-sectional view of an exemplary embodiment of a bonding member.

FIG. 13 is a cross-sectional view of an exemplary embodiment of a display module 10_1. FIG. 14 is a cross-sectional view of an exemplary embodiment of a bonding member.

Referring to FIGS. 13 and 14, the display module 10_1 according to the exemplary embodiment is different from the display module 10 according to the exemplary embodiment of FIG. 5 in that a second light absorbing pattern 325r is further disposed on a first surface of a first protective film 320.

More specifically, the second light absorbing pattern 325r may be disposed around the through hole OP. The second light absorbing pattern 325r may be disposed in a second non-display area NA2. The second light absorbing pattern 325r may be formed using the bonding member of FIG. 14. That is, as illustrated in FIG. 14, the bonding member may include a first light absorbing pattern 325a formed to be larger than the preliminary through hole area OPa described above in FIG. 7. The first light absorbing pattern 325a may have a larger planar size than the preliminary through hole area OPa to completely cover the preliminary through hole area OPa.

Since the first light absorbing pattern 325a according to the current exemplary embodiment has a larger planar size than the preliminary through hole area OPa, the through hole OP can be easily formed even if light emitted by a laser device 700 is not accurately aligned with a boundary of the preliminary through hole area OPa but is aligned outside the boundary.

The first light absorbing pattern 325a according to the current exemplary embodiment may have a generally circular or elliptical planar shape according to the planar shape of the preliminary through hole area OPa. However, the planar shape of the first light absorbing pattern 325a is not limited to these examples, and the first light absorbing pattern 325a may also have a triangular, quadrilateral, or other polygonal shapes as long as it is larger than the preliminary through hole area OPa in plan view.

The second light absorbing pattern 325r according to the current exemplary embodiment may have an annular shape like a ring completely surrounding the through hole OP in plan view. However, the planar shape of the second light absorbing pattern 325r can vary according to the planar shape of the first light absorbing pattern 325a.

Figure 15:
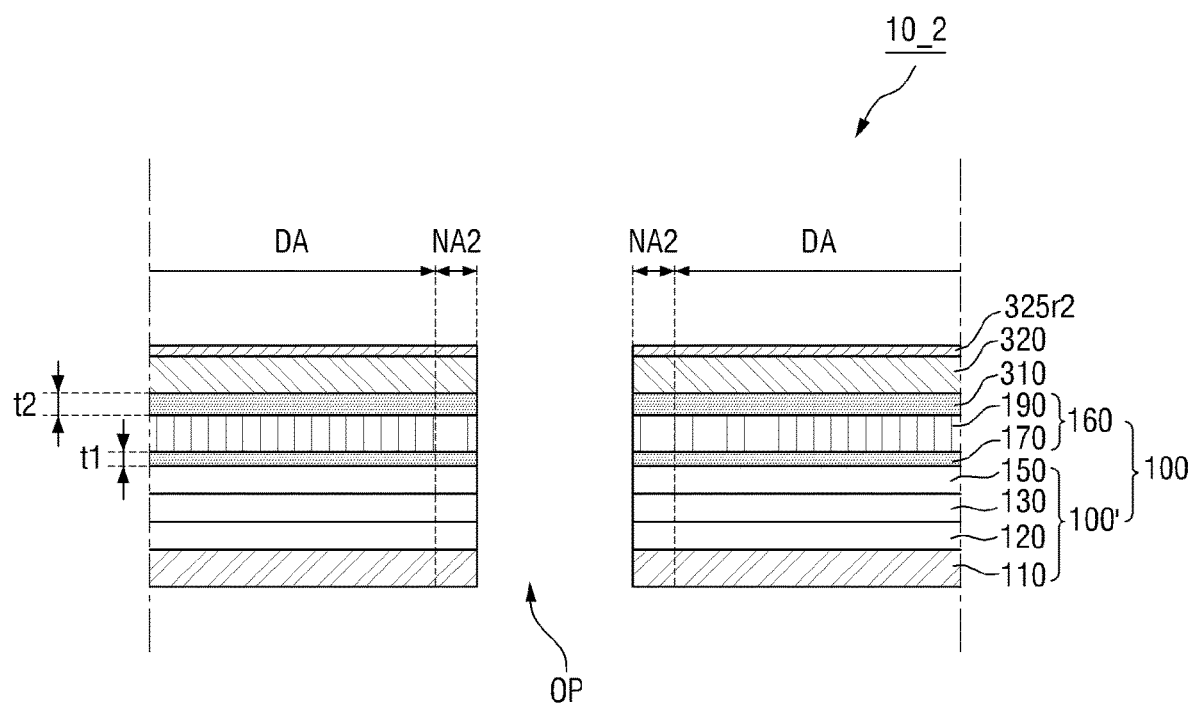
FIG. 15 is a cross-sectional view of another exemplary embodiment of a display module.
Figure 16:
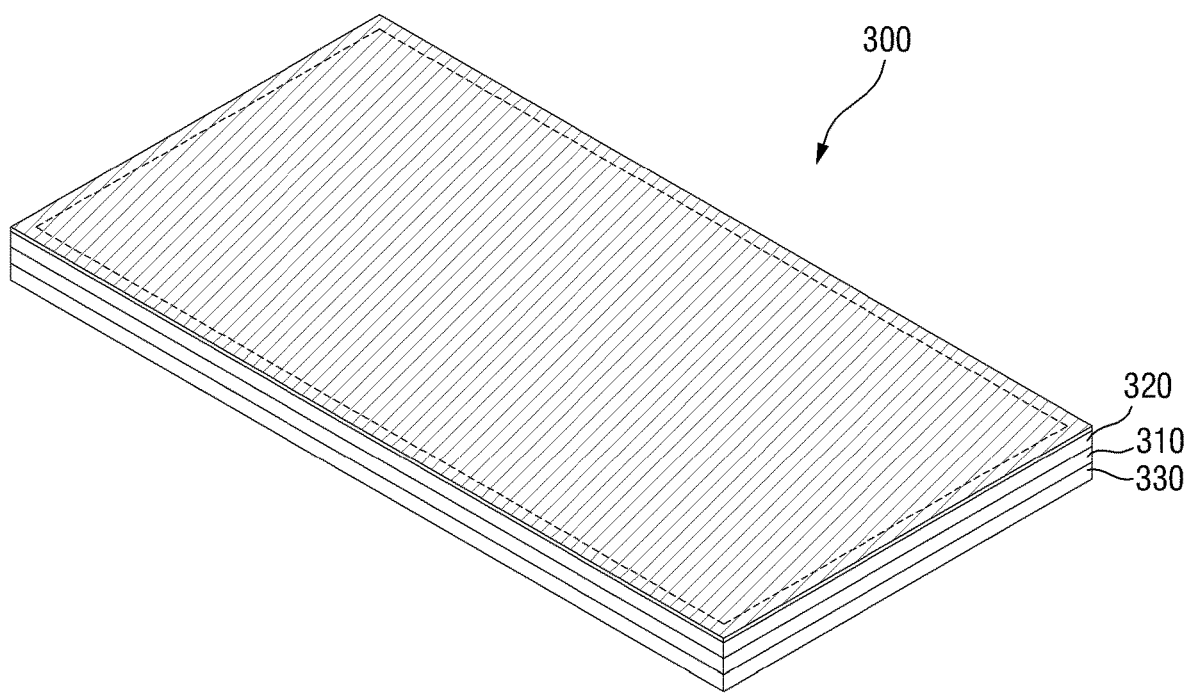
FIG. 16 is a perspective view of another exemplary embodiment of a bonding member.
Figure 16:
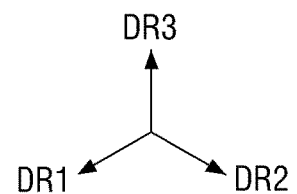

FIG. 15 is a cross-sectional view of another exemplary embodiment of a display module 10_2. FIG. 16 is a perspective view of another exemplary embodiment of a bonding member.

Referring to FIGS. 15 and 16, the display module 10_2 according to the exemplary embodiment is different from the display module 10 according to the exemplary embodiment of FIG. 5 in that a fourth light absorbing pattern 325r2 is further disposed on a first surface of a first protective film 320.

The fourth light absorbing pattern 325r2 according to the current exemplary embodiment may have a larger planar size than the second light absorbing pattern 325r of FIG. 13 and may substantially cover the entire first protective film 320 disposed under the fourth light absorbing pattern 325r2.

The fourth light absorbing pattern 325r2 may be disposed around the through hole OP. The fourth light absorbing pattern 325r2 may be disposed in a second non-display area NA2 and a display area DA. The fourth light absorbing pattern 325r2 may be formed using the bonding member 300 of FIG. 16. That is, as illustrated in FIG. 16, the bonding member 300 may include a third light absorbing pattern 325a1 formed to be larger than the preliminary through hole area OPa described above in FIG. 7. The third light absorbing pattern 325a1 may have a larger planar size than the preliminary through hole area OPa to completely cover the preliminary through hole area OPa. The third light absorbing pattern 325a1 may be disposed on substantially the entire surface of the first protective film 320.

Since the third light absorbing pattern 325a1 according to the current exemplary embodiment has a larger planar size than the preliminary through hole area OPa, the through hole OP can be easily formed even if light emitted by a laser device 700 is not accurately aligned with a boundary of the preliminary through hole area OPa but is aligned outside the boundary.

The fourth light absorbing pattern 325r2 according to the current exemplary embodiment may completely surround the through hole OP in plan view.

Figure 17:
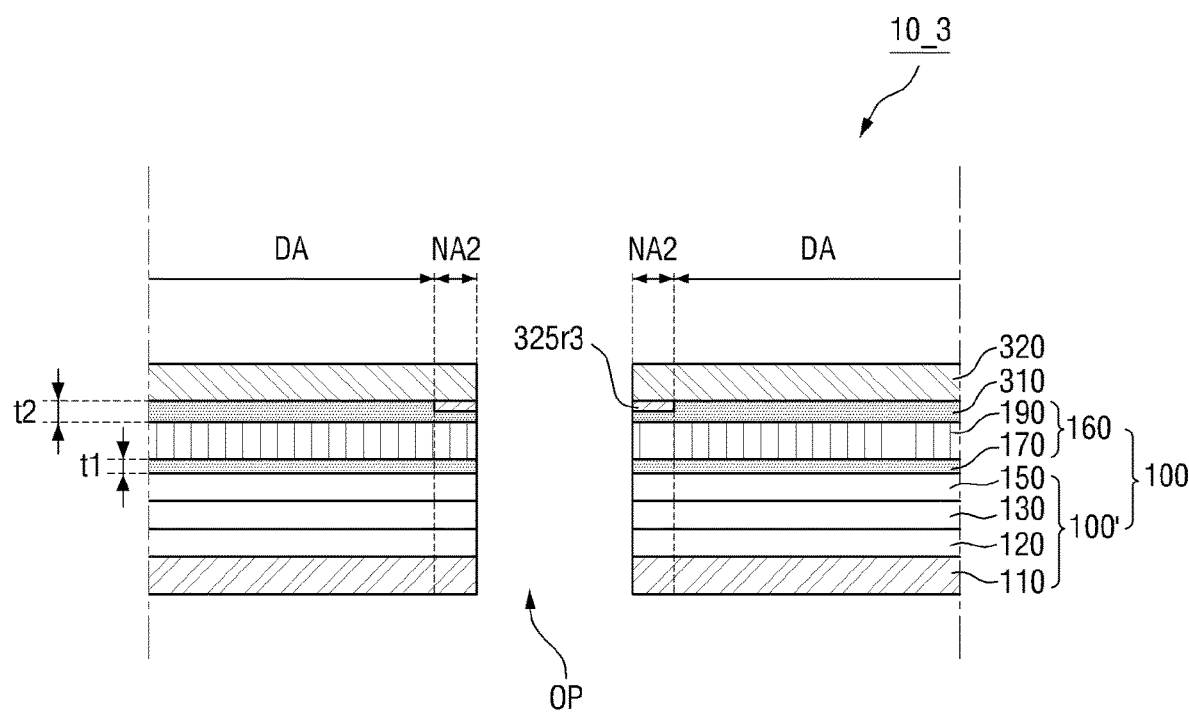
FIG. 17 is a cross-sectional view of still another exemplary embodiment of a display module.
Figure 18:
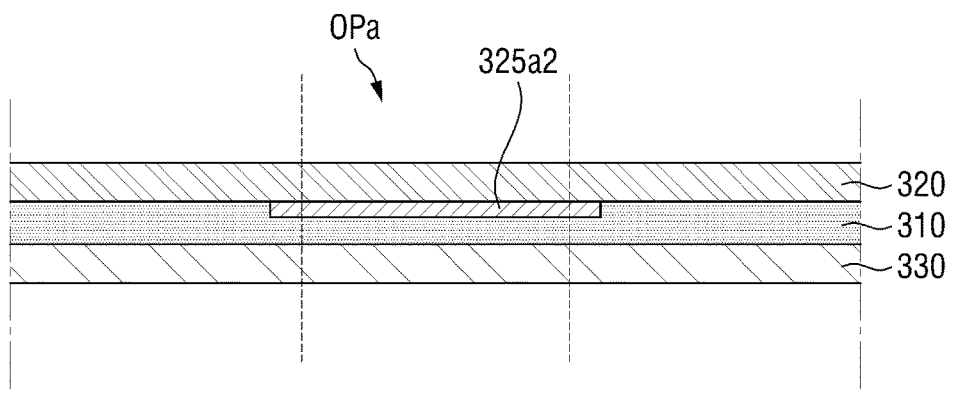
FIG. 18 is a cross-sectional view of still another exemplary embodiment of a bonding member.

FIG. 17 is a cross-sectional view of still another exemplary embodiment of a display module 10_3. FIG. 18 is a cross-sectional view of still another exemplary embodiment of a bonding member.

Referring to FIGS. 17 and 18, the display module 10_3 according to the exemplary embodiment is different from the display module 10 according to the exemplary embodiment of FIG. 5 in that a sixth light absorbing pattern 325r3 is further disposed on a second surface of a first protective film 320.

More specifically, the sixth light absorbing pattern 325r3 may be disposed around the through hole OP. The sixth light absorbing pattern 325r3 may be disposed in a second non-display area NA2. The sixth light absorbing pattern 325r3 may be disposed on the second surface of the first protective film 320 to directly contact the first inter-module bonding member 310.

The sixth light absorbing member 325r3 may be formed using the bonding member of FIG. 18. That is, as illustrated in FIG. 18, the bonding member may include a fifth light absorbing pattern 325a2 formed to be larger than the preliminary through hole area OPa described above in FIG. 7. The fifth light absorbing pattern 325a2 may have a larger planar size than the preliminary through hole area OPa to completely cover the preliminary through hole area OPa.

The fifth light absorbing pattern 325a2 may be disposed directly on the second surface of the first protective film 320 to directly contact the first inter-module bonding member 310.

In some exemplary embodiments, the fifth light absorbing pattern 325a2 may be disposed on substantially the entire surface of the first protective film 320.

Since the fifth light absorbing pattern 325a2 according to the current exemplary embodiment has a larger planar size than the preliminary through hole area OPa, the through hole OP can be easily formed even if light emitted by a laser device 700 is not accurately aligned with a boundary of the preliminary through hole area OPa but is aligned outside the boundary.

The fifth light absorbing pattern 325a2 according to the current exemplary embodiment may have a generally circular or elliptical planar shape according to the planar shape of the preliminary through hole area OPa. However, the planar shape of the fifth light absorbing pattern 325a2 is not limited to these examples, and the fifth light absorbing pattern 325a2 may also have a triangular, quadrilateral, or other polygonal shapes as long as it is larger than the preliminary through hole area OPa in plan view.

The sixth light absorbing pattern 325r3 according to the current exemplary embodiment may be annular in shape like a ring completely surrounding the through hole OP in plan view. However, the planar shape of the sixth light absorbing pattern 325r3 can vary according to the planar shape of the fifth light absorbing pattern 325a2.

According to an exemplary embodiment, since a light absorbing pattern is formed on a protective film disposed on a surface of an inter-module bonding layer, sufficient thermal energy may be transferred to the inter-module bonding layer even when a hole is formed simultaneously in a display panel and the inter-module bonding layer. Therefore, a module or foreign matter defect of the inter-module bonding layer can be reduced or prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display module for a display device comprising:
    a display panel;
    a first inter-module bonding layer disposed on an upper surface of the display panel;
    a first protective film having first surface and second opposed surfaces, the first protective film being disposed on an upper surface of the first inter-module bonding layer and having a light absorbing pattern disposed on the first surface or the second surface of the first protective film; and
    a through hole extending through the display panel, the first inter-module bonding layer and the first protective film,
    wherein the light absorbing pattern at least partially surrounds the through hole, wherein the display panel comprises:
    a display member including a substrate and a light emitting layer disposed on the substrate;
    an optical film disposed on the display member; and
    a second inter-module bonding layer to attach the display member and the optical film together,
    wherein the first inter-module bonding layer has a first thickness and the second inter-module bonding layer has a second thickness smaller than the first thickness.

2. The display module of claim 1, wherein the optical film comprises a polarizing film.

3. A bonding member for a display device comprising:
    a bonding layer;
    a first protective film disposed on an upper surface of the bonding layer;
    first and second light absorbing patterns on the upper surface of the bonding layer, the first and second light absorbing patterns overlapping the upper surface of the bonding layer, respectively; and
    a second protective film disposed under the bonding layer,
    wherein the first protective film is disposed under the first and second light absorbing patterns and the first and second light absorbing patterns are permanently coupled onto the upper surface of the first protective film.

4. The bonding member of claim 3, wherein the first protective film has first and second opposed surfaces, with the first surface contacting the bonding layer, and the first and second light absorbing patterns are disposed on the second surface.

5. The bonding member of claim 3, wherein the first light absorbing pattern is disposed inwardly from outer edges of the first protective film.

6. The bonding member of claim 3, wherein the second light absorbing pattern is disposed along edges of the first protective film.

* * * * *